(12) United States Patent
Bocchini et al.

(10) Patent No.: US 10,087,335 B2
(45) Date of Patent: Oct. 2, 2018

(54) METHOD FOR THE PREPARATION OF POLYANILINE/REDUCED GRAPHENE OXIDE COMPOSITES

(71) Applicant: FONDAZIONE ISTITUTO ITALIANO DI TECNOLOGIA, Genoa (IT)

(72) Inventors: Sergio Bocchini, Borgo San Dalmazzo (IT); Alessandro Chiolerio, Turin (IT); Samuele Porro, Pianezza (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 138 days.

(21) Appl. No.: 14/900,825

(22) PCT Filed: Jul. 4, 2014

(86) PCT No.: PCT/IB2014/062875
§ 371 (c)(1),
(2) Date: Dec. 22, 2015

(87) PCT Pub. No.: WO2015/001534
PCT Pub. Date: Jan. 8, 2015

(65) Prior Publication Data
US 2017/0051167 A1    Feb. 23, 2017

(30) Foreign Application Priority Data
Jul. 4, 2013   (IT) .............................. TO2013A0561

(51) Int. Cl.
C09D 11/52    (2014.01)
C09D 11/102   (2014.01)
(Continued)

(52) U.S. Cl.
CPC .......... *C09D 11/102* (2013.01); *C01B 32/182* (2017.08); *C08G 73/0266* (2013.01);
(Continued)

(58) Field of Classification Search
USPC ........................................................ 427/122
See application file for complete search history.

(56) References Cited

U.S. PATENT DOCUMENTS 9,318,231 B2 * 4/2016 Ku ......................... B82Y 30/00
2016/0225538 A1 * 8/2016 Xie ..................... C08G 73/0266

FOREIGN PATENT DOCUMENTS

CN    101985517    *  9/2010
CN    102492296       6/2012
(Continued)

OTHER PUBLICATIONS

Unsworth, J. et al., "Technical Review: Conducting Polymer Electronics," *Journal of Intelligent Material Systems and Structures*, pp. 380-395 (1992).
(Continued)

*Primary Examiner* — Brian K Talbot
(74) *Attorney, Agent, or Firm* — FisherBroyles, LLP; Susan M. Oiler

(57) ABSTRACT

Methods for obtaining composites of polyaniline and reduced graphene oxide are disclosed. The methods include dispersing graphene oxide in an acid aqueous solution containing an anionic emulsifying agent to obtain a dispersion of the graphene oxide, dissolving an aniline oligomer in an organic solvent to obtain a solution of the oligomer, and mixing the solution of the oligomer with the dispersion of graphene oxide to obtain a composite of polyaniline and reduced graphene oxide. The methods may also include recovering a precipitate of the polyaniline/reduced graphene oxide composite, and dissolving the precipitate in an organic
(Continued)

solvent to form a conductive ink or an ink for electronic devices.

11 Claims, 5 Drawing Sheets

(51) Int. Cl.
  C08G 73/02    (2006.01)
  C09D 11/30    (2014.01)
  H05K 1/09     (2006.01)
  C09D 11/38    (2014.01)
  C09D 179/02   (2006.01)
  H05K 3/12     (2006.01)
  C01B 32/182   (2017.01)

(52) U.S. Cl.
  CPC .............. C09D 11/30 (2013.01); C09D 11/38 (2013.01); C09D 11/52 (2013.01); C09D 179/02 (2013.01); H05K 1/092 (2013.01); H05K 3/125 (2013.01); H05K 2201/0329 (2013.01)

(56) References Cited

FOREIGN PATENT DOCUMENTS

CN    103086362    *  5/2013    ............. C01B 31/04
EP     3034467     *  6/2016

OTHER PUBLICATIONS

Bhadra, S. et al., "Progress in preparation, processing and applications of polyaniline," *Progress in Polymer Science*, 34, pp. 783-810 (2009).
Ray, A. et al., "Polyaniline: Doping, Structure and Derivatives," *Synthetic Metals*, 29, pp. E141-E150 (1989).
MacDiarmid, A.G., Synthetic Metals: A Novel Role for Organic Polymers (Nobel Lecture), *Angew. Chem. Int. Ed.*, 40, pp. 2581-2590 (2001).
Kang, E.T. et al., "Polyaniline: A Polymer With Many Interesting Intrinsic Redox States," *Prog. Polym. Sci.*, vol. 23, pp. 277-324 (1998).
Yang, H. et al., "The application of fast scan cyclic voltammetry. Mechanistic study of the initial stage of electropolymerization of aniline in aqueous solutions," *J. Electroanal. Chem.*, 339, pp. 423-449 (1992).
Lux, F., "Properties of Electronically conductive polyaniline: a comparison between well-known literature data and some recent experimental findings," *Polymer*, vol. 35, No. 14, pp. 2915-2936 (1994).
Shim, Y-B. et al., "Electrochemistry of Conductive Polymers VII. Autocatalytic Rate Constant for Polyaniline Growth," *Synthetic Metals*, 29, pp. E169-E174 (1989).
Shumakovich, G. et al., "Laccase-catalyzed oxidative polymerization of aniline dimer (N-phenyl-1,4-phenylenediamine) in aqueous micellar solution of sodium dodecylbenzenesulfonate," *Journal of Molecular Catalysis B: Enzymatic*, 69, p. 83-88 (2011).
Kotov, N.A. et al., "Ultrathin Graphite Oxide-Polyelectrolyte Composites Prepared by Self-Assembly: Transition Between Conductive and Non-Conductive States," *Adv. Mater.*, vol. 8, No. 8, pp. 637-641 (1996).
Li, D. et al., "Processable aqueous dispersions of graphene nanosheets," *Nature Nanotechnology*, vol. 3, pp. 101-105 (2008).
Park, S. et al., Colloidal Suspensions of Highly Reduced Graphene Oxide in a Wide Variety of Organic Solvents, *Nano Letters*, vol. 9, No. 4, pp. 1593-1597 (2009).
Li, X. et al., "Simultaneous Nitrogen Doping and Reduction of Graphene Oxide," *J. Am. Chem. Soc.*, 131, pp. 15939-15944 (2009).
Yamaguchi, H. et al., "Highly Uniform 300 mm Wafer-Scale Deposition of Single and Multilayered Chemical Derived Graphene Thin Films," *ACS Nano*, vol. 4., No. 1, pp. 524-528 (2010).
Lightcap, I.V. et al, "Anchoring Semiconductor and Metal Nanoparticles on a Two-Dimensions Catalyst Mat. Storing and Shuttling Electrons with Reduced Graphene Oxide," *Nano Letters*, 10, pp. 577-583 (2010).
Bai, H. et al., "Non-covalent functionalization of graphene sheets by sulfonated polyaniline," *Chem. Commun.*, pp. 1667-1669 (2009).
Wu, Q. et al., "Supercapacitors Based on Flexible Graphene/Polyaniline Nanofiber Composite Films," *ACS Nano*, vol. 4, No. 4, pp. 1963-1970 (2010).
Wang, H. et al., "Effect of Graphene Oxide on the Properties of Its Composite with Polyaniline," *ACS Applied Materials & Interfaces*, vol. 2, No. 3, pp. 821-828 (2010).
Zhou, X. et al., "Synthesis of graphene/polyaniline composite nanosheets mediated by polymerized ionic liquid," *Chem. Commun.*, 46, pp. 363-3665 (2010).
Boehm, H.P. et al., "Surface Properties of Extremely Thin Graphite Lamellae," *Fifth Conference on Carbon*, Pergamon Press, Oxford, pp. 73-80 (1962).
Xu, L.Q. et al., "Reduction of Graphene Oxide by Aniline with Its Concomitant Oxidative Polymerization," *Macromol. Rapid Commun.*, 32, pp. 684-688 (2011).
PCT, International Search Report and Written Opinion, International Application No. PCT/IB2014/062875, dated Oct. 21, 2014.
Giardi, R. et al., "Inkjet printed acrylic formulations based on UV-reduced graphene oxide nanocomposites," J. Mater. Sci. (2013) 48, 1249-1255.
Hu, Nantao et al., "Gas sensor based on p-phenylenediamine reduced graphene oxide," Sensors and Actuators B 163 (2012) 107-114.
Wei, Di et al., "Properties of graphene inks stabilized by different functional groups," Nanotechnology 22 (2011) 245702 (7 pp).
Xu, Li Qun et al., "Reduction of Graphene Oxide by Aniline with Its Concomitant Oxidative Polymerization," Macromol. Rapid Commun. (2011) 32, 684-688.
Kim et al., Capacitance behaviors of Polyaniline/Graphene Nanosheet Composites Prepared by Aniline Chemical Polymerization, Carbon Letters vol. 14, No. 1, 51-54 (2013).
Computer Generated Translation of Chinese Patent No. CN 103086362 (Apr. 11, 2018).

* cited by examiner

METHOD FOR THE PREPARATION OF POLYANILINE/REDUCED GRAPHENE OXIDE COMPOSITES

CROSS-REFERENCE TO RELATED APPLICATIONS

This application is a National Stage filing of International Application No. PCT/IB2014/062875, filed Jul. 4, 2014, which claims priority of Italian Application No. TO2013A000561, filed Jul. 4, 2013, which are incorporated herein by reference in their entireties.

TECHNICAL FIELD

The present invention concerns a method for obtaining polyaniline/reduced graphene oxide composites. In particular, said composites are used as conductive inks and in other electric and electronic applications such as: thermoelectric, electrochemical, electromagnetic, electromechanical, electro-luminescent, electro-rheological and chemical, for the production of membranes and sensors[1-2].

Intrinsically conducting polymers (ICPs) owe their electric conductivity to the presence of an electronic system π of conjugated type in their structure. Said polymers have a low optical transition energy, low ionisation potential and a high electronic affinity[1].

Polyaniline (PANI), in the form of a salt, is an intrinsically conducting polymer, with electric conductivity lower than other conducting polymers like doped polyacetylene or doped polyphenylene, but it is stabler and easier to synthesise[2]. Thanks to its ease of synthesis, good thermal stability, interesting redox properties and excellent application potential in the production of electronic and opto-electronic devices, polyaniline has become one of the most important conducting polymers and in the last twenty years has been the subject of numerous studies[3,4,5].

BACKGROUND ART

Numerous methods are known for the production of polyaniline, including chemical, electrochemical, photochemical and enzymatic methods, via the use of templating agents, by means of plasma[2]. The chemical polymerisation methods in turn comprise heterophasic polymerisation, polymerisation in solution, interface polymerisation, seeded polymerisation, polymerisation via metathesis, self-assembly polymerisation and polymerisation via the use of ultrasounds. Usually the starting monomer is aniline and the first stage of polymerisation in acid solution is oxidisation with the formation of a cationic radical. As illustrated in FIG. 1, the cationic radical can be located either on the nitrogen atom or on the carbon atoms in ortho or para position (Reaction (1)). The radicals react with one another to form an aniline dimer, N-phenyl-1,4-phenylenediamine (DANI)[6,7] (Reaction (2)).

Further oxidisation of the dimer generates radicals which combine to form oligomers of the aniline and, lastly, polyaniline itself (Reactions (3) and (4)). The dimer is a different chemical species which has a lower oxidisation potential and oxidises preferentially to the initial aniline. Chemical polymerisation is therefore an autocatalytic process, the kinetically limiting stage of which is the formation of the dimer[8].

To improve its electric conductivity or vary its chemical and electrochemical properties, the polyaniline itself can be combined with graphene or reduced graphene oxide (rGO).

Graphene is a structure composed of atoms of carbon arranged on a plane at the vertexes of hexagons. Graphene oxide (GO) has the same planar structure but with functional groups containing oxygen at the edges of the plane and included in the planar structure FIG. 2. Graphene oxide is obtained by exfoliation of graphite oxide[10]. The rGO has a structure similar to graphene but still retains some functional groups containing oxygen and is obtained by reduction of the graphene oxide. The rGO can be produced by chemical reduction, heat treatment or photoreduction[11,12,13,14,15]. The main reagents used to obtain rGO by means of chemical reduction are strong reducing agents like hydrazine, dimethylhydrazine, hydroquinone and sodium borohydride.

The methods for obtaining composites of PANI and rGO include direct mixing of PANI with rGO or reduction of graphene oxide (GO) in situ simultaneous with polymerisation in situ of the aniline in solution in the presence of rGO or GO[18,19].

GO is a strong oxidant[20] and for this reason has been used in the preparation of PANI-rGO composites in the form of nanofibres, exploiting the GO reduction process in the process of oxidative polymerisation of the aniline into polyaniline[21]. In this case the method of obtainment provides for the use of aniline as the starting monomer. Disadvantageously, aniline, a toxic substance and suspected carcinogen, significantly limits the application of said method. Furthermore the method described above leads to the formation of by-products bonded to the different types of radicals which the aniline can form in the first phase of polymerisation (Reaction (1) of FIG. 1), or a possible addition in ortho with formation of the dimer 2-Aminodiphenylamine thus producing a low regularity or branched polymer.

Furthermore the polyaniline/rGO composites obtained from aniline have shown that they do not form stable solutions or suspensions: the graphene does not remain in solution but can be easily separated by dissolution of the polyaniline into N,N-dimethylformamide and precipitation by centrifugation with partial reconstruction of the graphitic structure, as can be seen from X-ray analyses[21].

Lastly, the reaction takes place slowly during a 24-hour period, with kinetics demonstrated by the thermogravimetric analysis tests[21].

The need is therefore felt in the art for a preparation method for preparing composites of polyaniline and reduced graphene oxide from low toxicity reagents, which is conducted in an aqueous medium, which is quicker and simpler than the known methods, which allows a product to be obtained with high regularity and allows the preparation of stable polyaniline/reduced graphene solutions for applications such as flexible electronics obtained by inkjet printing.

DISCLOSURE OF INVENTION

The object of the present invention is therefore to provide a new preparation method which is free from the drawbacks of the methods described above.

Said object is achieved by the present invention, since it relates to a preparation method for preparing polyaniline/reduced graphene oxide composites. The method includes dispersing graphene oxide in an acid aqueous solution containing an anionic emulsifying agent to obtain a graphene oxide dispersion, dissolving one or more oligomers of the aniline in an organic solvent to obtain an oligomer solution, and then mixing the oligomer solution with graphene oxide dispersion to obtain a polyaniline/reduced graphene oxide composite.

BRIEF DESCRIPTION OF THE DRAWINGS

The present invention will now be described in detail with reference to the Figures of the accompanying drawings, in which.

BEST MODE FOR CARRYING OUT THE INVENTION

Figure 1:
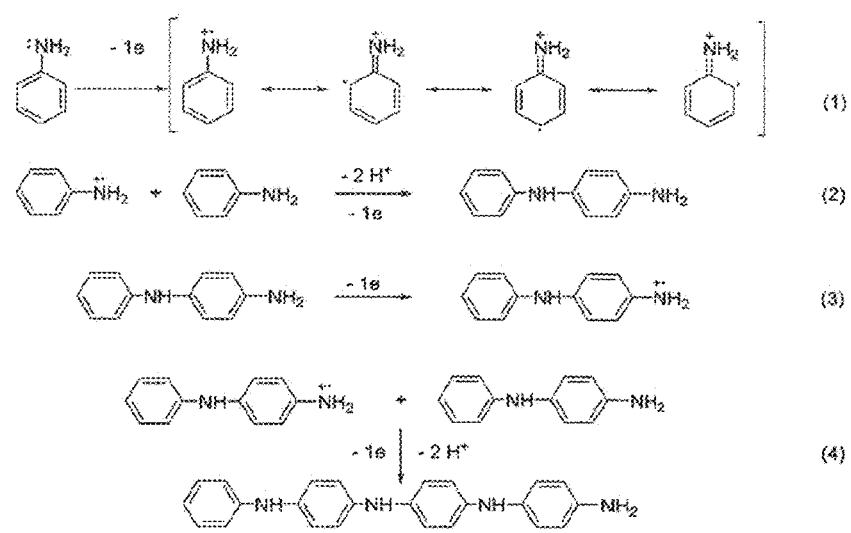
FIG. 1 illustrates a method of synthesis of the polyaniline according to the known art.
Figure 2:
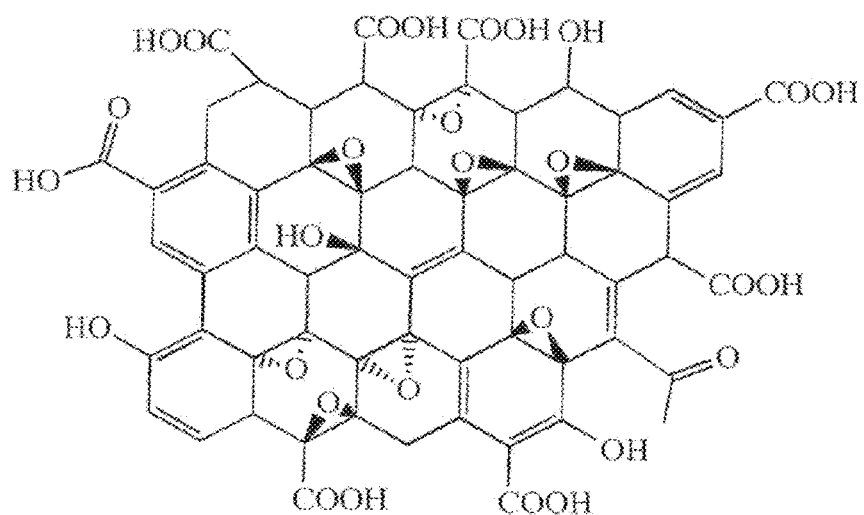
FIG. 2 illustrates the formula and structure of the graphene oxide.

According to a first aspect of the invention, a method is provided for obtaining composites of polyaniline and reduced graphene oxide comprising the steps of:
- dispersing the graphene oxide in an acid aqueous solution containing an emulsifying agent to obtain a dispersion of graphene oxide;
- dissolving one or more oligomers of aniline in an organic solvent to obtain an oligomer solution;
- mixing the oligomer solution with the dispersion of the graphene oxide to obtain a composite of polyaniline and reduced graphene oxide.

Advantageously, the present method allows a composite to be obtained containing chains of polyaniline having greater regularity since the oligomer origin reduces the statistical probability of branching in the ortho position of the aniline which is also reduced by the steric effect; the product thus obtained, thanks to the presence of the emulsifier which separates the sheets of rGO and binds the polyaniline to the graphene, forms stable solutions also in organic solvents such as DMSO therefore simplifying the end use as ink in inkjet printing techniques.

Unlike the methods that use aniline as a starting monomer, polymerisation from oligomers, preferably dimers, does not entail the use of toxic reagents, making the reaction easier to perform. Lastly the use of oligomers allows the concentration of the reduced graphene oxide in the final composite to be modulated so that use can be limited to the quantity strictly necessary, thus permitting variation in the conductivity (which diminishes as the quantity of graphene diminishes) of the composite according to the type of application required.

In this text, by "oligomer" we mean a composite resulting from the polymerisation of a finite and reduced number of monomer units, preferably from 2 to a maximum of 10 monomer units.

In one embodiment, the oligomers of the aniline can be optionally substituted in the ortho and meta positions at the nitrogen atom or on the nitrogen atom with a radical selected from the group consisting of methoxyl, ethyloxyl, propyloxyl, methyl, ethyl, propyl, isopropyl, butyl, isobutyl, terbutyl, pentyl, phenyl, sulfonyl and vinyl.

The use an emulsifier allows the problem of solubilisation of said oligomers in aqueous solution to be overcome, forming a stable suspension.

In one embodiment, the aniline oligomer used is the dimer (N-phenyl-1,4-phenylenediamine) (DANI).

The oligomer is dissolved in an organic solvent preferably chosen from the group consisting of 1,2-butanediol, 1,3-butanediol, 1,3-propanediol, 1,4-butanediol, 1,4-dioxane, 1,5-pentanediol, 1-propanol, 2-butoxyethanol, 2-propanol, acetaldehyde, acetic acid, acetone, acetonitrile, butyric acid, diethanolamine, diethylene triamine, dimethoxyethane, dimethyl sulfoxide, N,N-dimethylformamide, ethanol, ethylamine, ethylene glycol, formic acid, furfuryl alcohol, glycerol, methanol, methyl diethanolamine, methyl isocyanide, propanoic acid, propylene glycol, pyridine, tetrahydrofuran, triethylene glycol, N-methylpyrrolidone, N,N-dimethylacetamide.

The graphene oxide is suspended in an acid aqueous solution containing the anionic emulsifier, for example chosen from the group consisting of sulfonates, phosphorylates and carboxylates, preferably chosen from the group consisting of poly(sodium 4-styrene sulfonate) (PSS), dodecylbenzenesulfonate (DBSA), methylbenzenesulfonate (MBSA), 2-amino-ethyl-phosphonate, polyacrylate, adipate, poly(2-acrylamide-3-methyl-1-propane sulfonate), dodecyl diphenyloxide disulfonate, N, N'-dimethyl (methacryloyl ethyl) ammonium propane sulfonate, 2-acrylamide-2-methyl-1-propane sulfonate, isophthalate-5-sulfonate. The acid aqueous solution is an aqueous solution of an acid selected from the group consisting of hydrochloric acid, nitric acid, sulphuric acid and phosphoric acid.

The method of the invention, despite the use of the aniline dimer, notoriously non-soluble in water, can be performed in an aqueous environment for the formation of a stable emulsion thanks to the action of the emulsifier present in the graphene oxide solution.

During the polymerisation reaction, the graphene oxide acts as an oxidiser of the dimer forming the polyaniline, while the graphene oxide is reduced by the DANI forming the reduced graphene.

Advantageously, the dimer has proved to be a more effective reducing agent for the graphene oxide than the aniline and therefore the reaction speed is higher, resulting in a complete reaction within 1 hour at 80° C. as against a reaction time in the use of the aniline of 24 hours at 70° C.[21].

In one embodiment, after mixing the graphene oxide suspension and the oligomer solution, the reaction mixture is heated to a temperature in the range between 40 and 90° C., preferably between 60 and 80° C., in particular for a time interval of between 20 minutes and 6 hours, to promote and accelerate the polymerisation.

If reduction of the reduced graphene oxide load is desired, it is possible to substitute the dianiline with an oligomer having a higher molecular weight.

The polymer thus obtained has proved to have excellent conductivity characteristics and can be used as a conductive ink.

Further characteristics of the present invention will become clear from the following description of some merely illustrative non-limiting examples.

The following abbreviations are used in the examples below: min (minutes), h (hours), g (grams), mg (milligrams), ml (milliliters), nm (nanometers), Da (Dalton), mmol (millimoles), M (molar), W (Watt), ° C. (degrees Centigrade), Hz (Hertz), V (Volt), PANI (polyaniline), ICPs (intrinsically conducting polymers), DANI (aniline dimer, N-phenyl-1,4-phenylenediamine), GO (graphene oxide), rGO (reduced graphene oxide), PSS (poly(sodium 4-styrene sulfonate)), DBSA (dodecylbenzenesulfonic acid), DMSO (dimethylsulfoxide), TEM (tunnel effect scanning microscope).

Example 1

Synthesis of the Composite of Polyaniline and Reduced Graphene Oxide

The single layer graphene oxide was obtained from CheapTubes.com Brattleboro, Vt. (USA) and used as received. The aniline dimer, the PSS (Mn=70000 Da), HCl (37%) and the DMSO (99.9%) were obtained from Sigma Aldrich, Milan, Italy and used as received. 0.1 g of GO were added to 100 ml of HCl 0.1 M containing 1.0 g PSS. This dispersion was treated with a 250 W ultrasound probe using 20% actual power for 1 h so as to obtain a stable dispersion of GO/PSS.

Separately 1.0 g of DANI were dissolved in 10 ml of DMSO. This solution was added dropwise to the dispersion of GO/PSS.

The reaction was maintained for 1 h at 80° C. so as to obtain complete reduction of GO. The final dispersion first turned a green colour and then a dark green precipitate was obtained and a colourless supernatant.

The colour change was attributed to the oxidisation of DANI to PANI by the graphene oxide which is consequently reduced. The precipitate was recovered by means of filtration and washed twice with distilled water and once with ethanol so as to eliminate the PSS and the excess DANI respectively, lastly the product was dried at 60° C. to a constant weight.

Example 2

Figure 3:
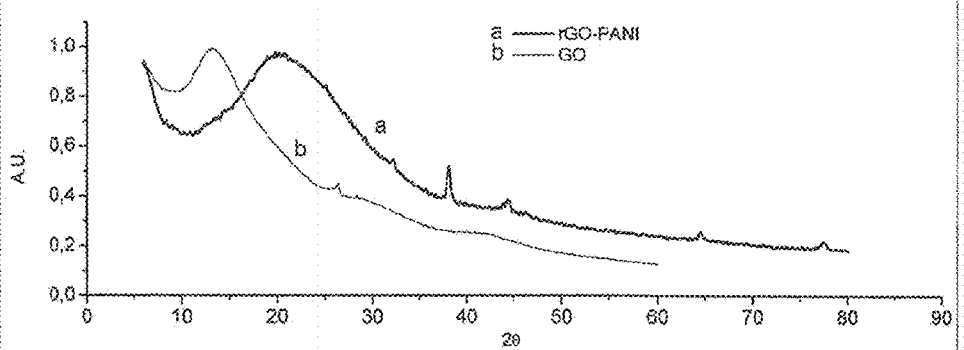
FIG. 3 illustrates the X-ray spectrum of the composite according to the invention (rGO-PANI) compared with that of the starting graphene oxide (GO)

Physical-Chemical Characterisation of the Composite Obtained According to the Invention The product obtained was analysed under X-ray so as to verify any aggregation between the graphene layers. The product obtained was dissolved in DNSO and deposited on glass, and the spectrum obtained was compared with the spectrum obtained from the starting GO. The results are shown in FIG. 3.

The starting GO has an amorphous band with a maximum at 2θ=13° while the PANI-rGO composite produced has a band with a maximum around 2θ=20° due to the presence of polyaniline and 2θ=38° due to partial formation of a lamellar structure similar to that of the graphite and present in the reduced graphene oxide (rGO).

Figure 4:
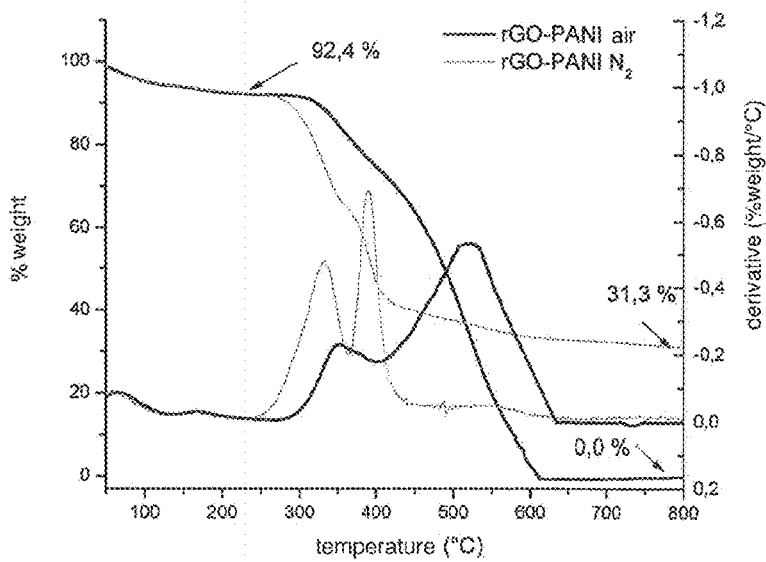
FIG. 4 illustrates the thermogravimetric analysis of the composite according to the invention (rGO-PANI) in air and in nitrogen.

The thermogravimetry (TGA) in air and in nitrogen (shown in FIG. 4) of the PANI-rGO shows its composition. From the TGA in nitrogen, the percentage concentration of the product can be traced back. The two degradation peaks at approximately 300° C. and 400° C. are due to the presence of PSS and PANI respectively. The peak at approximately 550° C. is due to the loss of the residual oxygen in the reduced graphene oxide. The residue, 31.3% by weight, is approximately one third of the initial weight, excluding the weight loss due to the presence of adsorbed water, and is due to the remaining graphene. The TGA in air confirms the absence of inorganic material, in this case carbonisation of the material and its complete elimination occur due to oxidisation of the carbonaceous material with a peak having maximum degradation speed 530° C.

Figure 5:
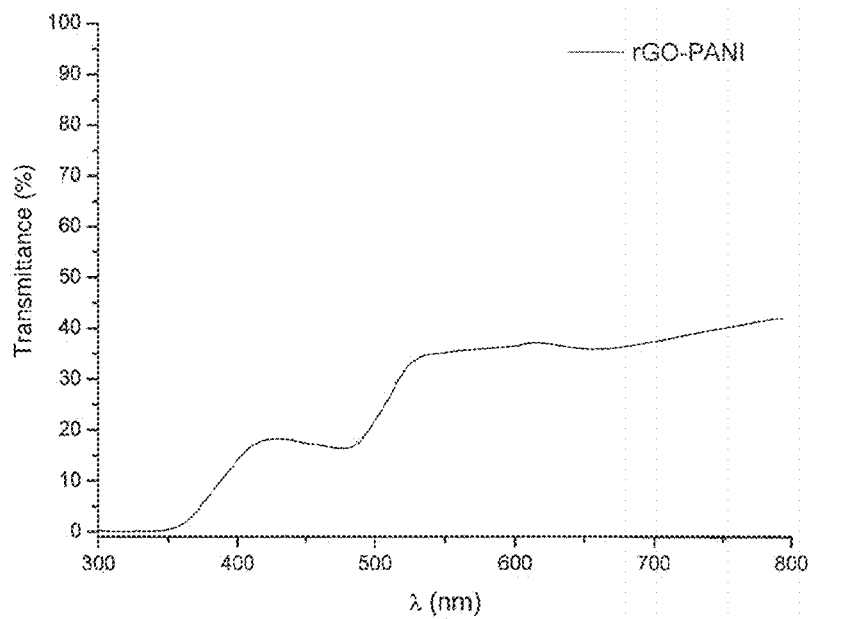
FIG. 5 illustrates the UV-VIS spectrum of the composite according to the invention (rGO-PANI) dissolved in DMSO (transmittance)
Figure 6:
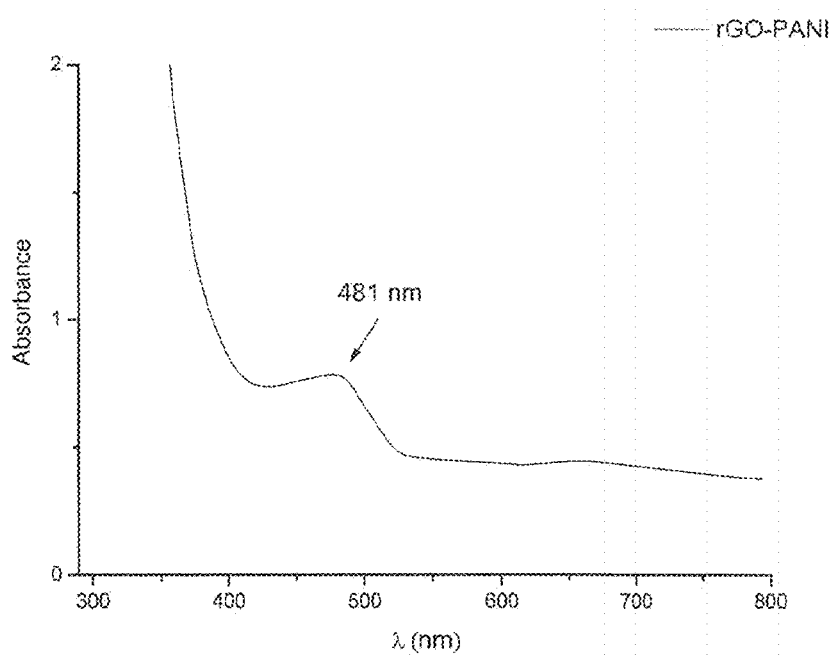
FIG. 6 illustrates the UV-VIS spectrum of the composite according to the invention (rGO-PANI) dissolved in DMSO (Absorbance)

The reaction product is completely soluble in DMSO and it is therefore possible to perform a UV spectrophotometry. The results are shown in FIG. 5. Observing the transmittance at a dilution of 0.1 mg/ml it can be observed that it is below 50% throughout the visible field and the nearby ultraviolet, reaching saturation at 300 nm as would be expected from the presence of graphene. The presence of an absorption around 300 nm is also an indicator of the presence of polymerised polyaniline which has its main absorption at this wavelength. From the graph transformed into absorbance the absorption at 481 nm typical of the PANT in the form of salt, therefore conductive, can be seen (FIG. 6).

Figure 7:
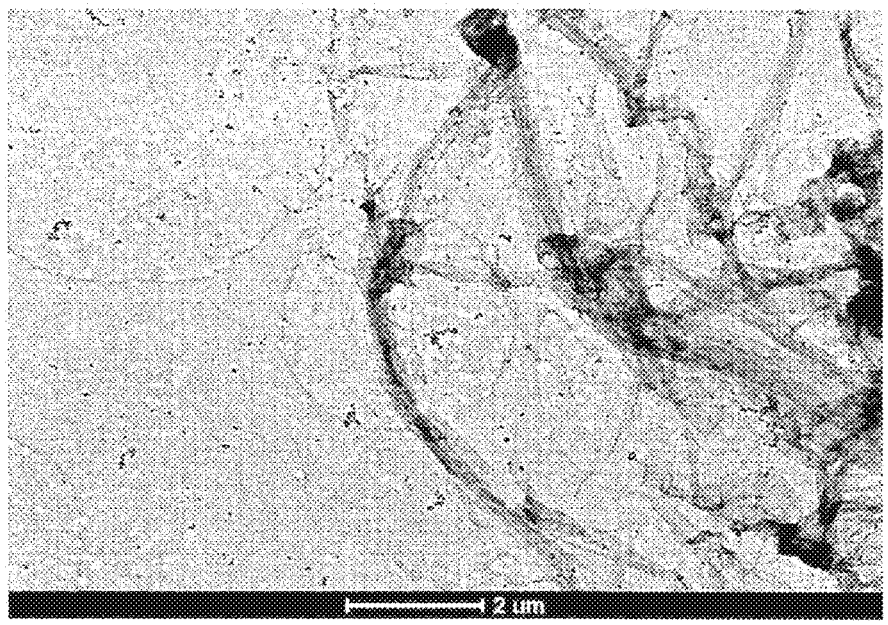
FIG. 7 illustrates a transmission electron microscopy (TEM) of the composite according to the invention.
Figure 8:
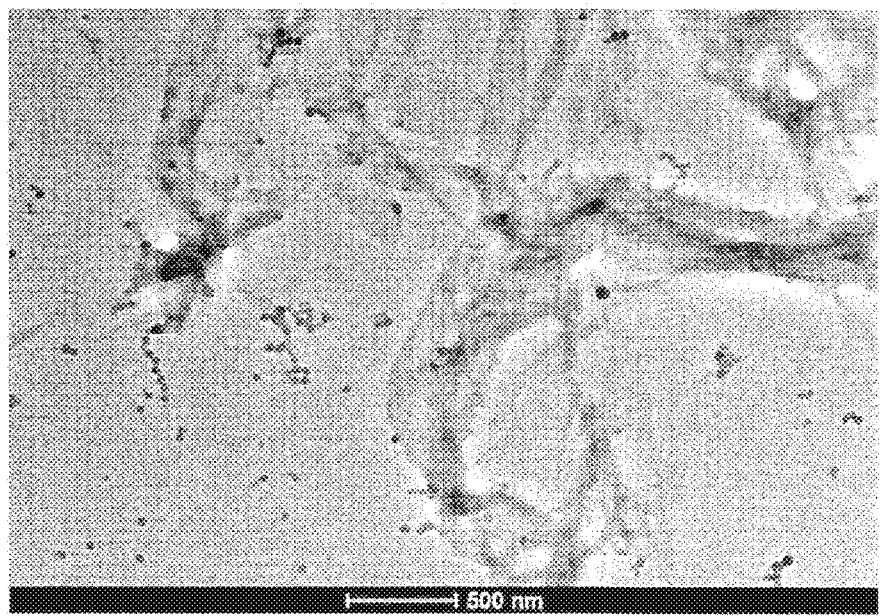
FIG. 8 illustrates a transmission electron microscopy (TEM), enlargement of the image shown in FIG. 7.

The product was dissolved in DMSO at the concentration of 0.01 mg ml$^{-1}$ and deposited on a sample holder to perform a tunnel effect scanning microscope analysis (TEM). The result, shown in FIGS. 7 and 8, was the presence of grapheme lamellae partially crumpled onto themselves and held together by polyaniline (dark clots). The small nuclei visible in the two TEM images are probably due to the polyaniline or to the presence of the emulsifier PSS. The TEM analysis shows that contrary to the synthesis starting from aniline, the addition of an emulsifier allows the formation of lamellae of reduced graphene oxide closely bonded to the polymer by the presence of the emulsifier.

Example 3

Preparation of the Polyaniline and Reduced Graphene Oxide Ink and Printing 0.05 g of the material synthesised according to example 1 were dissolved using 2.45 g of an organic solvent (DMSO) in a beaker immersed in an ultrasound bath for two hours at ambient temperature resulting in a stable uniform solution.

The ink was inserted in a 3 ml Teflon cartridge, loaded in an ink-jet printer provided with quartz capillary piezoelectric head, diameter 80 micrometers, with control of the fluid mechanics and printing processes by PC by means of appropriate software. The dimension and speed of the ink drops were controlled by means of a horizontal TV camera positioned integral with the x-y plane. The printing parameters were set using an asymmetric impulse wave, with initial slope of 15 microseconds, set point 20 microseconds at 40 volts, slope down 10 microseconds, slope down for negative voltages 20 microseconds, negative set point 2 microseconds at −20 volt. The vibration frequency of the piezo during the printing was varied between 250 and 500 Hz. In some cases, a heating system was used to heat the print head up to 45° C. to obtain a correct ink viscosity value to optimise printability.

Figure 9:
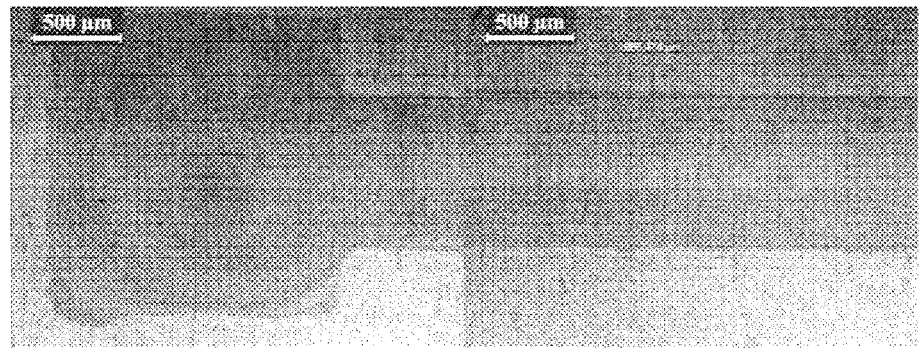
FIG. 9 illustrates two optical microscope details of traces printed on commercial polyimide substrate.

The ink was tested by printing patterns for electric measurements with known length and variable width on substrates of sheets of commercial polyimide (poly-oxydiphenylene-pyromellitimide) and then left to dry in the air. The optical microscope analysis of the printed traces reveals a uniform continuous structure (FIG. 9). The apparent non-uniformities are due to the print substrate.

Example 4

Electric Characterisation of the Composite Obtained According to the Invention

Figure 10:
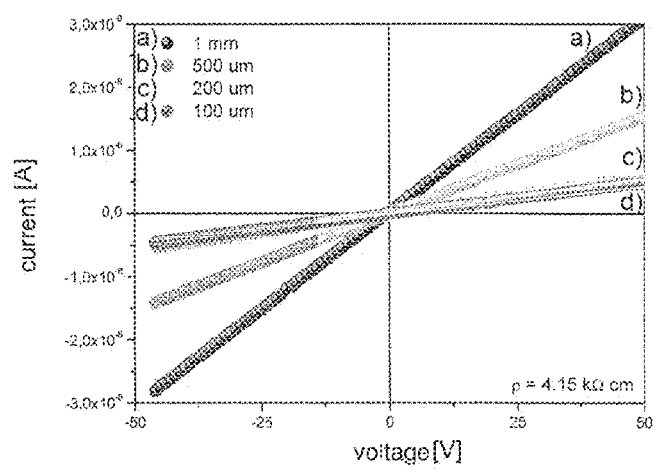
FIG. 10 illustrates an example of collection of curves I-V in the range −50, +50V, with variation in the width of the printed trace for the rGO-PANI composite.

The electric characterisation of the printed samples is performed at ambient temperature, using a system of micro-joysticks to position two needles above the printed patterns (two-contact configuration), then acquiring information relative to the geometry of the sample and the distance of the contacts in order to extrapolate the resistivity values. The measuring instrument is a Keithley 2635A, normally the measuring range is from −200 to +200 V. After collecting the curves I-V of the printed patterns, the data are analysed, fitting the curves in the linear region with a straight line for extrapolation of the conductance. Once the geometric parameters of the conductance are known, the resistivity is obtained, which is an intrinsic property of the material. Its resistivity is approximately 4.15 k$\Omega$cm (FIG. 10).

Figure 11:
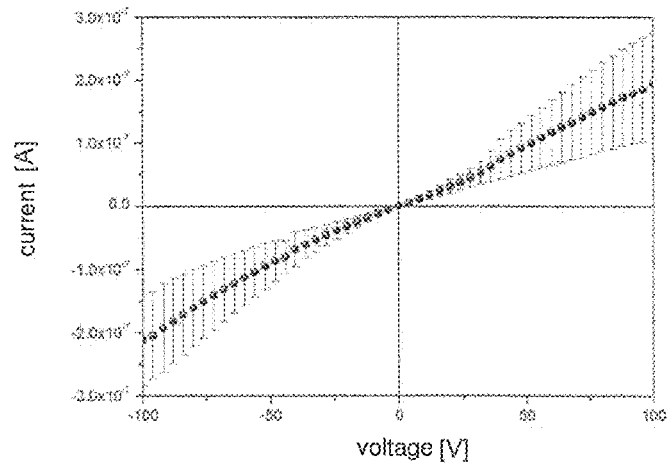
FIG. 11 illustrates an example of collection of curves I-V in the range −100, +100V of PANI, with indication of the experimental error bars.

The sample of rGO-PANI was compared with a sample of PANI produced in analogous conditions using an oxidant such as ammonium persulphate instead of the graphene oxide. The sample was deposited by means of solvent-casting on Teflon®. Using the geometric parameters, the resistivity was obtained. Its resistivity was 3.88±0.01 M$\Omega$cm (FIG. 11), therefore the presence of rGO increased the conductivity by several orders of magnitude, thus also demonstrating its reduction.

REFERENCES

1. J. Unsworth, B. A. Lunn, P. C. Innis, Z. Jin, A. Kaynak, and N. G. Booth, J. Intell. Mater. Syst. Struct., 1992, 3, 380.
2. Bhadra S, Khastgir D, Singha N K, Lee J H. Progress in preparation, processing and applications of Polyaniline. Progr Polym Sci. 2009; 34(8), 783-810.
3. Ray A, Asturias G E, Kershner D L, Richter A F, MacDiarmid A G, Epstein A J. Polyaniline: Doping, structure and derivatives. Synt Met. 1989; 29(1): 141-50.
4. MacDiarmid A G, "Synthetic Metals": A Novel Role for Organic Polymers (Nobel Lecture). Angew Chem Int Ed. 2001; 40(14): 2581-90.
5. Kang E, Neoh K G, Tan K L. Polyaniline: A polymer with many interesting intrinsic redox states. Progr Polym Sci. 1998; 23(2): 277-324.
6. Yang H, Bard A J. The application of fast scan cyclic voltammetry. Mechanistic study of the initial stage of electropolymerization of aniline in aqueous solutions. J Electroanal Chem 1992; 339(1-2): 423-49.
7. Lux F. Properties of electronically conductive polyaniline: a comparison between well-known literature data and some recent experimental findings. Polymer. 1994; 35(14): 2915-36.
8. Shim Y B, Park S M. Electrochemistry of conductive polymers VII. Autocatalytic rate constant for polyaniline growth. Synt Met. 1989; 29(1), 169-174
9. Shumakovich G, Streltsov A, Gorshina E, Rusinova T, Kurova V, Vasil'eva I et al. A. Laccase-catalyzed oxidative polymerization of aniline dimer (N-phenyl-1,4-phenylenediamine) in aqueous micellar solution of sodium dodecylbenzenesulfonate. J Mol Catal B: Enzym. 2011; 69(3-4): 83-88.
10. Kotov N A, Dekany I, Fendler J H. Ultrathin graphite oxide-polyelectrolyte composites prepared by self-assembly: Transition between conductive and non-conductive states Adv. Mater. 1996; 8: 637-41.
11. Li D, Muller M B, Gilje S, Kaner R B, Wallace G G, Nat. Nanotechnol. 2008, 3, 101.
12. Park S J, An J H, Jung I H, Piner R D, An S J, Li X S et al Nano Lett. 2009, 9, 1593.
13. Li X L, Wang H L, Robison J T, Sanchez H, Diankov G, Dai H J. J. Am. Chem. Soc. 2009, 131, 15939.
14. Yamaguchi H, Eda G, Mattevi C, Kim H, Chhowalla M. ACS Nano 2010, 4, 524.
15. Lightcap I V, Kosel T H, Kamat P V, Nano Lett. 2010, 10, 577.
16. Bai H, Xu Y X, Zhao L, Li C, Shi G Q. Chem. Commun. 2009, 1667.
17. Wu Q, Xu Y X, Yao Z Y, Liu A R, Shi G Q, ACS Nano 2010, 4, 1963.
18. Wang H L, Hao Q L, Yang X J, Lu L D, Wang X. ACS Appl. Mater. Interfaces 2010, 2, 821.
19. Zhou X, Wu T, Yang G, Han B. Synthesis of graphene/polyaniline composite nanosheets mediated by polymerized ionic liquid. Chem Commun. 2010; 46(21): 3663-5.
20. Boehm H P, Clauss A, Fischer G, Hofmann U. Fifth Conference on Carbon, Pergamon Press, Oxford 1962, p. 73.
21. Xu L Q, Liu Y L, Neoh K G, Kang E T, Fu G D. Reduction of graphene oxide by aniline with its concomitant oxidative polymerization. Macromol Rap Comm. 2011; 32(8): 684-8.

The invention claimed is:

1. Method for obtaining polyaniline/reduced graphene oxide composites comprising the steps of:
    dispersing the graphene oxide in an acid aqueous solution containing an anionic emulsifying agent to obtain a graphene oxide dispersion;
    dissolving one or more oligomers of the aniline in an organic solvent to obtain an oligomer solution;
    mixing said oligomer solution with said dispersion of graphene oxide to obtain a polyaniline/reduced graphene oxide composite.

2. Method according to claim 1 wherein said oligomer is a dimer of aniline.

3. Method according to claim 1 wherein said oligomer is substituted alternatively in one of the ortho and meta positions at the nitrogen atom or on the nitrogen atom itself by a radical selected from the group consisting of methoxyl, ethyoxyl, propyloxyl, methyl, ethyl, propyl, isopropyl, butyl, isobutyl, terbutyl, pentyl, phenyl, sulfonyl, and vinyl.

4. Method according to claim 1, wherein said anionic emulsifying agent is selected from the group consisting of poly(styrene sulfonate), dodecylbenzenesulfonate, methylbenzenesulfonate (MBSA), 2-amino-ethyl-phosphonate, polyacrylate, adipate, poly(2-acrylamide-3-methyl-1-propane sulfonate), dodecyl diphenyloxide disulfonate, N, N'-dimethyl (methacryloyl ethyl) ammonium propane sulfonate, 2-acrylamide-2-methyl-1-propane sulfonate, and isophthalate-5-sulfonate.

5. Method according to claim 1, wherein said organic solvent is selected from the group consisting of 1,2-butanediol, 1,3-butanediol, 1,3-propanediol, 1,4-butanediol, 1,4-dioxane, 1,5-pentanediol, 1-propanol, 2-butoxyethanol, 2-propanol, acetaldehyde, acetic acid, acetone, acetonitrile, butyric acid, diethanolamine, diethylene triamine, dimethoxyethane, dimethyl sulfoxide, N,N-dimethylformamide, ethanol, ethylamine, ethylene glycol, formic acid, furfuryl alcohol, glycerol, methanol, methyl diethanolamine, methyl isocyanide, propanoic acid, propylene glycol, pyridine, tetrahydrofuran, triethylene glycol, N-methylpyrrolidone, and N,N-dimethyl acetamide.

6. Method according to claim 1, further comprising a heating step after said step of mixing said oligomer solution with said dispersion of graphene oxide.

7. Method according to claim 6, wherein said heating is performed at a temperature ranging from 40 to 90° C.

8. Method according to claim 6, wherein said heating is performed in a time ranging from 20 minutes to 6 hours.

9. Method according to claim 1, wherein said acid aqueous solution is an aqueous solution of an acid chosen from the group consisting of hydrochloric, nitric, sulphuric and phosphoric acid.

10. The method of claim 1, further comprising:
recovering a precipitate of the polyaniline/reduced graphene oxide composite; and
dissolving the precipitate in an organic solvent to form a conductive ink.

11. The method of claim 10, further comprising:
printing the conductive ink on to a substrate.

* * * * *